US012787433B2

(12) United States Patent
Li et al.

(10) Patent No.: US 12,787,433 B2
(45) Date of Patent: Nov. 3, 2026

(54) ARRAY SUBSTRATE, FABRICATION METHOD OF ARRAY SUBSTRATE, AND MASK

(71) Applicant: HEFEI VISIONOX TECHNOLOGY CO., LTD., Hefei (CN)

(72) Inventors: Yang Li, Hefei (CN); Feng Yu, Hefei (CN); Bo Li, Hefei (CN); Jianqiu Sun, Hefei (CN); Weihua Li, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 861 days.

(21) Appl. No.: 17/986,287

(22) Filed: Nov. 14, 2022

(65) Prior Publication Data

US 2023/0071876 A1 Mar. 9, 2023

Related U.S. Application Data

(63) Continuation of application No. PCT/CN2021/108750, filed on Jul. 27, 2021.

(30) Foreign Application Priority Data

Sep. 30, 2020 (CN) ........................ 202011063235.7

(51) Int. Cl.

*H10D 86/60* (2025.01)
*H10D 86/01* (2026.01)
*H10D 86/40* (2025.01)

(52) U.S. Cl.

CPC ......... *H10D 86/60* (2025.01); *H10D 86/0231* (2025.01); *H10D 86/443* (2025.01)

(58) Field of Classification Search

CPC ... H10D 86/60; H10D 86/0231; H10D 86/443
See application file for complete search history.

(56) References Cited

U.S. PATENT DOCUMENTS

| | | | | |
|---|---|---|---|---|
| 2004/0041149 A1* | 3/2004 | Baek | H10D 30/6739 257/E29.151 |
| 2015/0044789 A1* | 2/2015 | Yamada | H01L 22/32 438/18 |

(Continued)

FOREIGN PATENT DOCUMENTS

| | | | | |
|---|---|---|---|---|
| CN | 103149760 A | 6/2013 | |
| CN | 104538408 * | 4/2015 | H10D 30/6757 |

(Continued)

OTHER PUBLICATIONS

Notice of Allowance issued on Apr. 2, 2024, in corresponding Korean Application No. 10-2022-7040378, 4 pages.

(Continued)

*Primary Examiner* — Jeff W Natalini
*Assistant Examiner* — Andrew John Zabel
(74) *Attorney, Agent, or Firm* — Maier & Maier, PLLC

(57) ABSTRACT

An array substrate, a fabrication method of the array substrate and a mask, where a metal film is provided on a substrate, a first groove and a second groove are formed on the metal film, the bottom surface of the first groove is closer to the substrate compared to that of the second groove, a projection of the first groove on a plane parallel to the substrate is located within that of the second groove, thereby reducing a slope of a notch sidewall, avoiding the sliding of formed subsequent film layers off the first notch sidewall; the metal film may be covered by the subsequent film layers, improving the performance of the array substrate.

5 Claims, 3 Drawing Sheets

(56) References Cited

U.S. PATENT DOCUMENTS

| | | | | |
|---|---|---|---|---|
| 2015/0187817 | A1* | 7/2015 | Kim | H10D 30/031 438/158 |
| 2020/0249510 | A1* | 8/2020 | Asai | G02F 1/1368 |
| 2020/0292890 | A1* | 9/2020 | Ishikawa | G02F 1/136204 |
| 2021/0193699 | A1* | 6/2021 | Jang | H10D 86/481 |

FOREIGN PATENT DOCUMENTS

| | | | | | |
|---|---|---|---|---|---|
| CN | 105097834 | A | | 11/2015 | |
| CN | 107170749 | A | | 9/2017 | |
| CN | 108493155 | A | | 9/2018 | |
| CN | 105068373 | B | | 5/2019 | |
| CN | 109727912 | A | | 5/2019 | |
| CN | 110444567 | | * | 11/2019 | H10D 86/0231 |
| CN | 111446264 | A | | 7/2020 | |
| CN | 112185985 | A | | 1/2021 | |
| DE | 102019135043 | A1 | * | 7/2020 | H10D 30/6757 |
| KR | 1020120060048 | A | | 6/2012 | |
| KR | 1020150028404 | A | | 3/2015 | |

OTHER PUBLICATIONS

Office Action issued on Mar. 9, 2024, in corresponding Korean Application No. 10-2022-7040378, 12 pages.

International Search Report and Written Opinion issued on Nov. 1, 2021 in corresponding application No. PCT/CN2021/108750, 10 pgs.

Office Action issued on Sep. 9, 2023, in corresponding Chinese Application No. 202011063235.7, 8 pages, partial English translation provided.

* cited by examiner

ARRAY SUBSTRATE, FABRICATION METHOD OF ARRAY SUBSTRATE, AND MASK

CROSS-REFERENCE TO RELATED APPLICATIONS

The present application is a continuation of International Application No. PCT/CN2021/108750, filed on Jul. 27, 2021, which claims priority to Chinese Patent Application No. 202011063235.7, entitled "Array Substrate, Fabrication Method of Array Substrate, and Mask", and filed with the China National Intellectual Property Administration (CNIPA) on Sep. 30, 2020, both of which are hereby incorporated by reference in their entireties.

TECHNICAL FIELD

Embodiments of the present application relate to the technical field of display devices, and more particularly relate to an array substrate, a fabrication method of the array substrate and a mask.

BACKGROUND

The display panel generally includes an array substrate and a light-emitting layer disposed on the array substrate, and the array substrate includes thin film transistors controlling light emitting of the light-emitting layer. In the related art, the array substrate includes a substrate and a metal film formed on the substrate, the array substrate further has a display region and a non-display region surrounding the display region, the metal film in the display region includes gate electrodes and capacitor plates, and the metal film in the non-display region includes a plurality of wires which are parallel and spaced apart. When producing, a metal film is formed on a substrate firstly, then a photoresist is formed on the metal film, and a mask is covered on the photoresist, in which the mask is provided with openings, followed by removing a part of the metal film corresponding to the openings by etching, thereby forming the gate electrode, the capacitor plates and the wires.

However, in the etching process, the part of metal film corresponding to the openings is removed to form a notch on the metal film, and side walls of the notch are relatively steep; in the follow-up process, as the forming of other film layers on the metal film, the other film layers tend to slip easily at the side walls of the notch; as a result, the other film layers are not able to completely cover the metal film, thereby affecting performance of the array substrate.

SUMMARY

In view of this, in embodiments of the present application, there are provided an array substrate, a fabrication method of the array substrate and a mask, in order to solve the technical problems that the sliding of other film layers easily off a notch sidewall when the other film layers form on a metal film in follow-up process due to the relatively steep notch sidewall forming in the metal film of the array substrate, which causes that the other film layers are not able to completely cover the metal film, thereby affecting the performance of the array substrate.

In an embodiment of the present application, there is provided an array substrate, which includes a substrate and a metal film disposed on the substrate, where the metal film a is provided with a first notch, the first notch includes a first groove located in a middle of the first notch and a second groove located at an edge of the first groove and communicated with the first groove, a bottom surface of the first groove is closer to the substrate compared to a bottom surface of the second groove, and a projection of the first groove on a plane parallel to the substrate is located within that of the second groove on the plane parallel to the substrate.

The array substrate is as described above, in which the array substrate has a display region and a non-display region surrounding the display region, the metal film is also provided with a second notch, the second notch is disposed in the display region, the metal film is divided by the second notch to obtain a gate electrode, the first notch is disposed in the non-display region, and the metal film is divided by the first notch to obtain a wire.

In an embodiment of the present application, there is further provided a fabrication method of an array substrate, including:

- providing a substrate;
- forming a metal film on the substrate;
- forming a photoresist on the metal film and covering the photoresist with a mask, where, the mask has a first opening, the first opening is provided with a semi-permeable membrane, and the semi-permeable membrane is provided with a light-transmitting hole;
- subjecting the photoresist to exposure so as to form a first strong exposure area facing the light-transmitting hole and a weak exposure area facing the semi-permeable membrane in the photoresist;
- etching the metal film to form a first notch in the metal film, where the first notch includes a first groove facing the first strong exposure area and a second groove facing the weak exposure area, a bottom surface of the first groove is closer to the substrate compared to that of the second groove, and a projection of the first groove on a plane parallel to the substrate is located within that of the second groove on the plane parallel to the substrate.

In an embodiment of the present application, there is further provided a mask, including a plate body, where the plate body is provided with a first opening, the first opening is provided with a semi-permeable membrane, the semi-permeable membrane is provided with a light-transmitting hole, the mask is configured to etch a metal film on an array substrate to form a first groove facing the light-transmitting hole and a second groove facing the semi-permeable membrane.

The mask is as described above, in which the mask further includes a second opening, the second opening is disposed to face a part of the metal film in a display region of an array substrate, and the first opening is disposed to face a part of the metal film in a non-display region of an array substrate, the second opening is configured to form a gate electrode in the metal film, and the first opening is configured to form a wire in the metal film.

In an embodiment of the present application, there are provided an array substrate, a fabrication method of the array substrate, and a mask, where a metal film is provided on a substrate, a first notch is formed in the metal film, the first notch includes a first groove and a second groove communicated with the first groove, a bottom surface of the first groove is closer to the substrate compared to that of the second groove, and a projection of the first groove on a plane parallel to the substrate is located within that of the second groove on the plane parallel to the substrate. In this way, the first groove and the second groove form the first notch, the metal film is divided by the first notch to obtain a corresponding shape; and the second groove has a smaller depth, thereby reducing the slope of a first notch sidewall, as a result, the sliding of subsequent film layers off the first notch sidewall during the forming of subsequent film layers may be avoided, so that the subsequent film layers are able to cover the metal film, improving the performance of the array substrate.

BRIEF DESCRIPTION OF THE DRAWINGS

In order to illustrate the technical solutions of embodiments of the present application or in the prior art more clearly, the accompanying drawings needed to be used in the description of the embodiments or the prior art will be briefly introduced in the following; and it is obvious that the accompanying drawings in the following description are intended for some embodiments of the present application. For those skilled in the art, other accompanying drawings may also be obtained according to these accompanying drawings without paying creative labor.

DETAILED DESCRIPTION OF THE EMBODIMENTS

Figure 1:
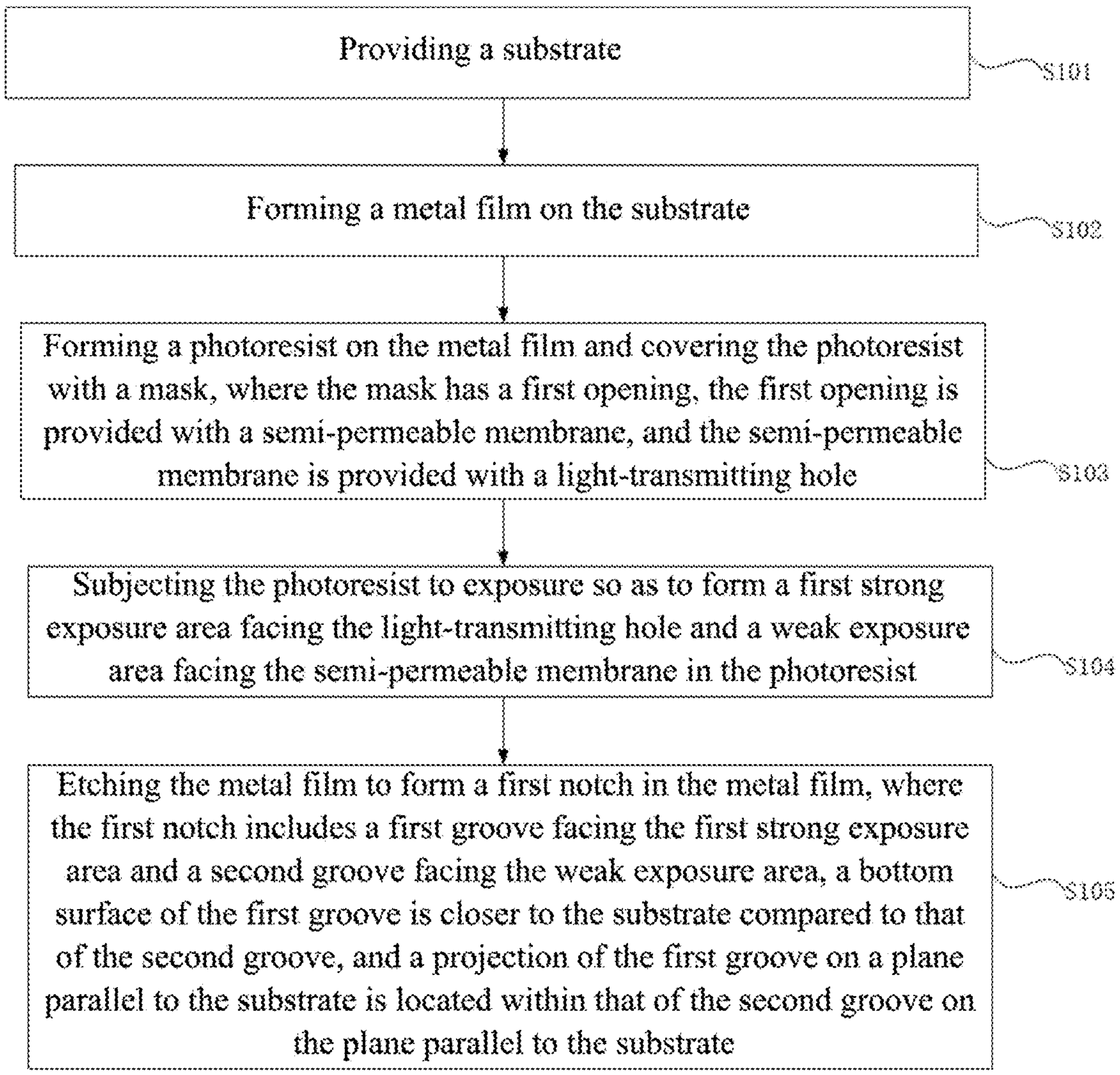
FIG. 1 is a flow chart of a fabrication method of an array substrate provided by embodiments of the present application.

To make the objectives, technical solutions, and advantages of embodiments of the present application clearer, the technical solutions in embodiments of the present application will be described clearly and comprehensively below with reference to the accompanying drawings in embodiments of the present application. Apparently, the described embodiments are merely a part rather than all embodiments of the present application. All other embodiments obtained by persons of ordinary skill in the art based on embodiments of the present application without any creative effort shall fall within the protection scope of the present application.

Generally, the display panel includes a light-emitting layer and an array substrate which are stacked, and the array substrate is provided with thin film transistors controlling light emitting of the light-emitting layer.

In the related art, the array substrate includes a substrate and a metal film formed on the substrate, the array substrate further has a display region and a non-display region surrounding the display region, the metal film in the display region includes gate electrodes and capacitor plates, and the metal film in the non-display region includes a plurality of wires which are parallel and spaced apart. When producing, the metal film is formed on the substrate firstly, then a photoresist is formed on the metal film, and a mask is covered on the photoresist, in which the mask is provided with an opening which is enclosed for forming the gate electrodes, capacitor plates and wires, and a part of the metal film corresponding to the openings is removed by etching, thereby forming the gate electrodes, the capacitor plates and the wires.

However, in the etching process, the part of metal film corresponding to the openings is removed to form a notch in the metal film, and a side wall of the notch is relatively steep; in the follow-up process, as the forming of other film layer on the metal film, the other film layer tends to slip easily at the side wall of the notch; as a result, the other film layer is not able to completely cover the metal film and short circuit, open circuit and other conditions occur in the subsequent process, thereby affecting the performance of the array substrate.

The present embodiment provides an array substrate, a fabrication method of the array substrate, and a mask, in which a first groove and a second groove communicated with the first groove are formed in the metal film, a bottom surface of the first groove is closer to the substrate compared to that of the second groove, and a projection of the first groove on a plane parallel to the substrate is located inside that of the second groove on the plane parallel to the substrate; so that a notch sidewall formed by the first groove and the second groove is inclined relative to the substrate, thereby slowing down the slope of the notch sidewall, and further preventing a subsequent film layer from falling out of the notch sidewall when forming the subsequent film layer, which improves the performance of the array substrate.

Figure 2:
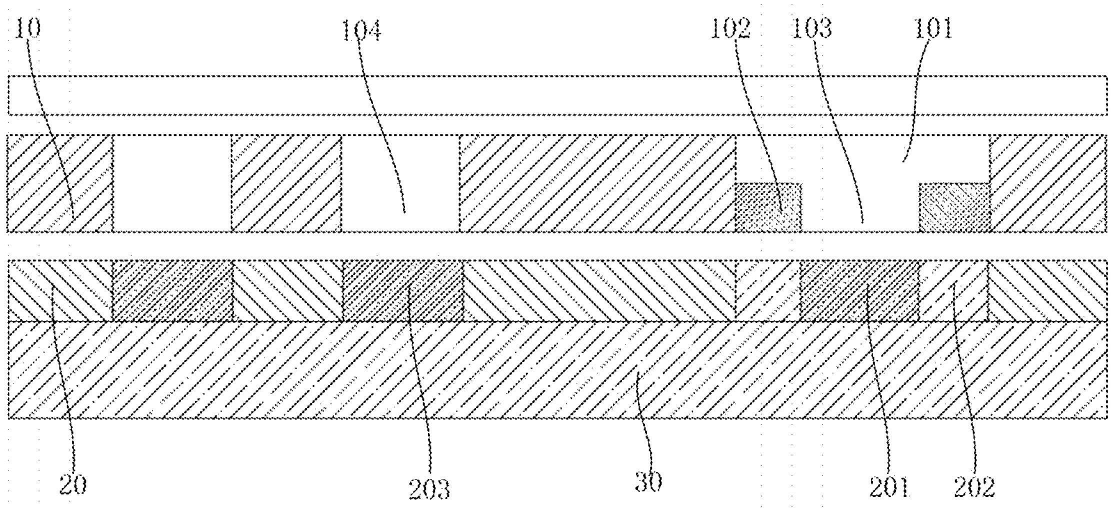
FIG. 2 is a schematic diagram of exposure operation in a fabrication method of an array substrate provided by embodiments of the present application.
Figure 3:
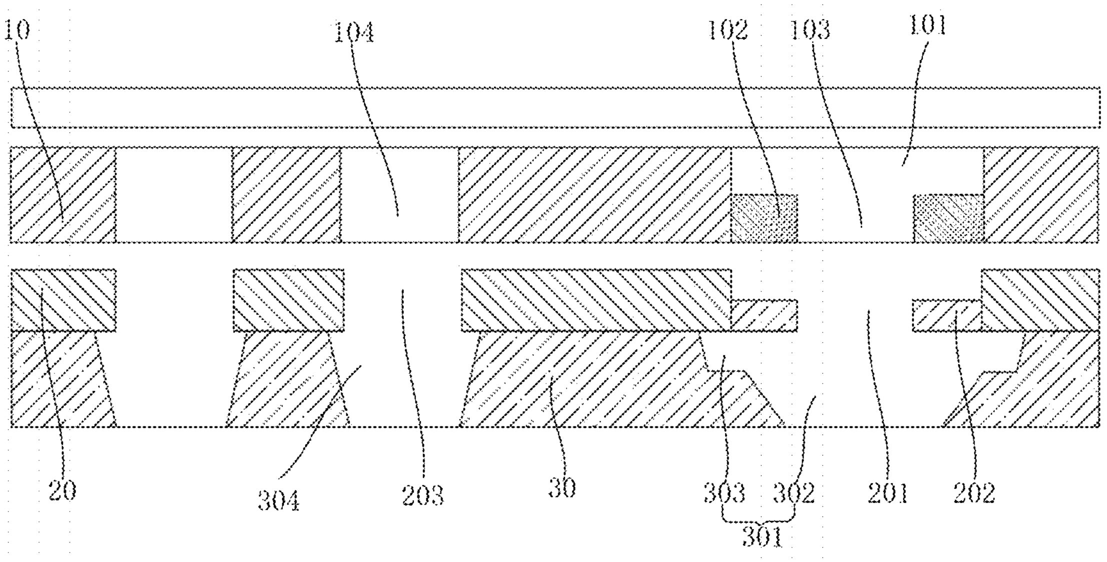
FIG. 3 is a schematic diagram after etching in a fabrication method of an array substrate provided by embodiments of the present application.
Figure 4:
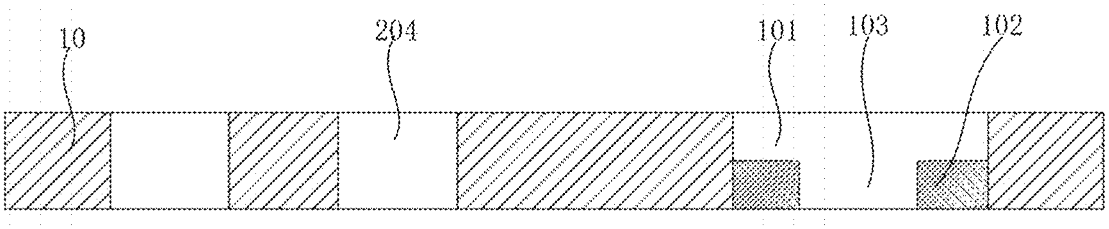
FIG. 4 is a structural diagram of a mask provided by embodiments of the present application.
Figure 5:
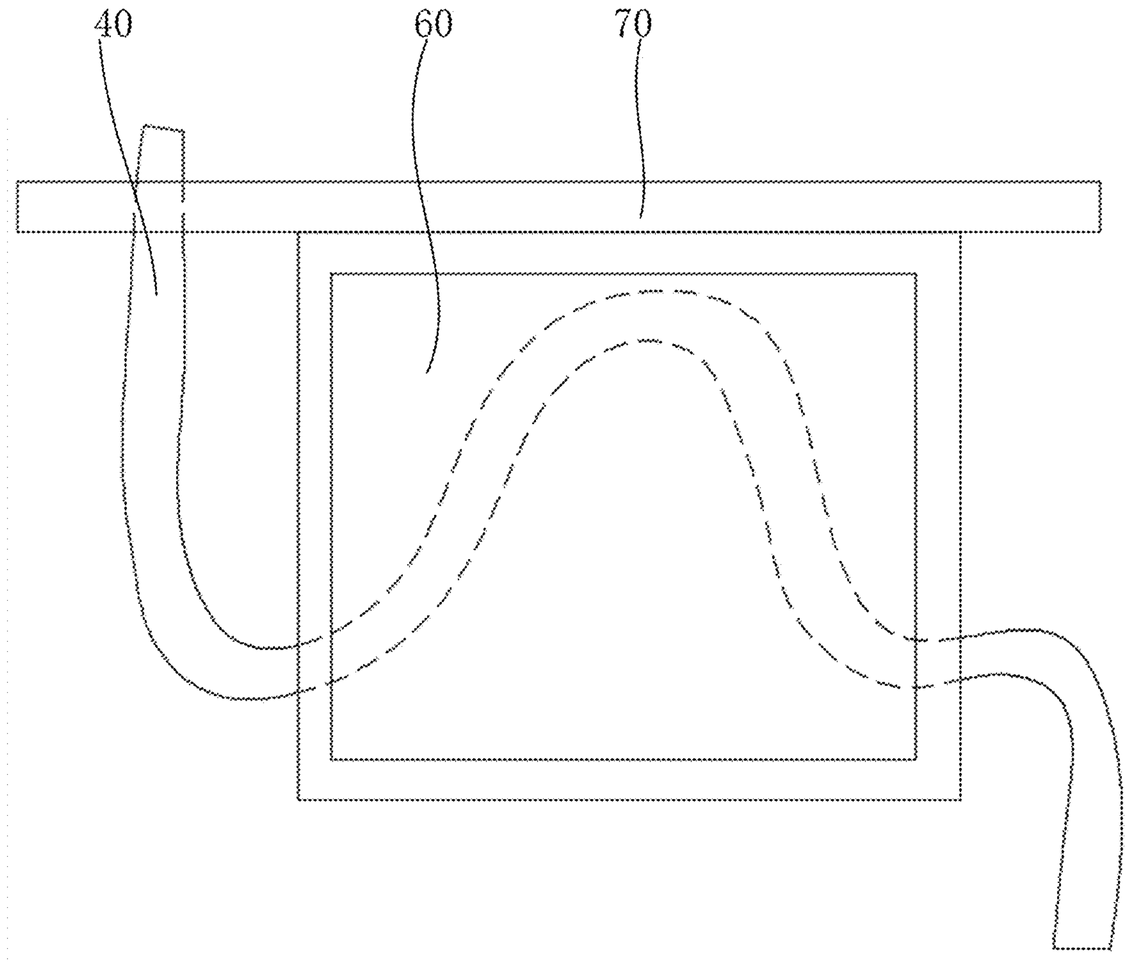
FIG. 5 is a top view of an array substrate provided by embodiments of the present application.
Figure 6:
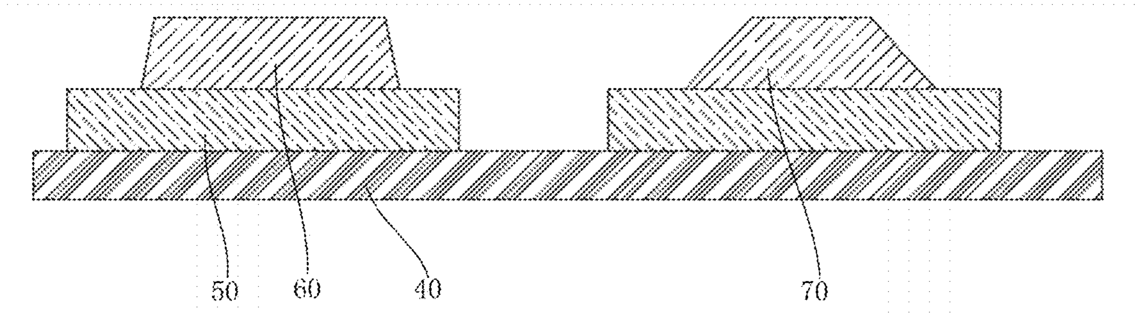
FIG. 6 is a section view of an array substrate provided by embodiments of the present application.

Referring to FIG. 2 to FIG. 6, in embodiments of the present application, there is provided an array substrate, including a substrate and a metal film 30 disposed on the substrate, in which the metal film 30 is provide with a first notch 301. The first notch 301 includes a first groove 302 located in the middle of the first notch 301, and a second groove 303 located at an edge of the first groove 302 and communicated with the first groove 302. A bottom surface of the first groove 302 is closer to the substrate compared to a bottom surface of the second groove 303, and a projection of the first groove 302 on a plane parallel to the substrate is located within that of the second groove 303 in the plane parallel to the substrate.

The array substrate includes a substrate, and a buffer layer, a channel structure 40, a gate electrode insulating layer 50, a gate electrode layer, a first insulating layer, a capacitor layer, a second insulating layer and a source electrode layer or a drain electrode layer stacked sequentially on the substrate; in which the gate electrode layer is a metal layer and includes a first capacitor plate, a gate electrode 60 and a wire 70. The capacitor layer is a metal layer and includes a capacitor plate facing the first capacitor plate, so that the first capacitor plate and the second capacitor plate may form a capacitor. The source electrode layer and the drain electrode layer may also be a metal layer, and a source/drain electrode is configured to connect with the channel structure 40.

The metal film 30 of the present embodiment may be the gate electrode layer, and the metal film 30 is configured to form the gate electrode 60, the first capacitor plate and the wire 70 which are faced the channel structure 40. Exemplarily, the wire 70 may be a scan wire or a data wire. Certainly, in this embodiment, the metal film 30 may also be the capacitor layer or the source electrode layer, a drain electrode layer and the like, and the metal film 30 is not limited in the present embodiment.

In the production process, the first notch 301 is formed by a mask 10, where the mask 10 has a first opening 101, the first opening 101 is provided with a semi-permeable membrane 102, and the semi-permeable membrane 102 is provided with a light-transmitting hole 103. The semi-permeable membrane 102 is configured to form the second groove 303, and the light-transmitting hole 103 is configured to form the first groove 302.

Specifically, the metal film 30 is firstly formed, followed by forming the photoresist 20 on the metal film 30, and the photoresist 20 is covered by the mask 10; then the photoresist 20 is subjected to exposure to form a first strong exposure area 201 facing the light-transmitting hole 103 and a weak exposure area 202 facing the semi-permeable membrane 102 in the photoresist 20; and the metal film 30 is etched to form the first notch 301 in the metal film 30. The first notch 301 includes the first groove 302 facing the first strong exposure area 201 and the second groove 303 facing the weak exposure area 202, and the bottom surface of the first groove 302 is closer to the substrate compared to that of the second groove 303. In the plane parallel to the substrate, the projection of the first groove 302 is located within that of the second groove 303.

That is, the second groove 303 is provided around the first groove 302 and is located at the edge of the first groove 302, and the second groove 303 is communicated with the first groove 302, so that the first notch 30 formed by the second groove 303 and the first groove 302 has a stepped sidewall.

The first strong exposure area 201 has a higher degree of exposure, such that a photoresist 20 of the first exposure area is etched at a faster rate; and the weak exposure area 202 has a weaker degree of exposure, such that the weak exposure area 202 is etched at a slower rate. Therefore, within the same etching time, a part of the metal film 30 corresponding to the first strong exposure area 201 is etched to a larger depth, and a part of the metal film 30 corresponding to the weak exposure area 202 is etched to a smaller depth, such that the depth of the first groove 302 is greater than the depth of the second groove 303.

Through above arrangement, the array substrate includes the substrate and the metal film 30 disposed on the substrate, in which the metal film 30 is provided with a first notch 301. The first notch 301 includes the first groove 302 located in the middle of the first notch 301 and the second groove 303 located at the edge of the first groove 302 and communicated with the first groove 302. The bottom surface of the first groove 302 is closer to the substrate compared to that of the second groove 303, and the projection of the first groove 302 in the plane parallel to the substrate is located within that of the second groove 303 in the plane parallel to the substrate. By such arrangement, the first groove 302 and the second groove 303 form the first notch 301, the metal film 30 is divided the first notch 301 to obtain a corresponding shape, and the second groove 303 has a smaller depth, thereby reducing the slope of the sidewall of the first notch 301, and avoiding the sliding of a subsequent film layer off the sidewall of the first notch 301 when the subsequent film layer is formed. The subsequent film layer is able to cover the metal film 30, improving the performance of the array substrate.

In an implementation in which the metal film 30 is a gate electrode layer, the metal film 30 may be divided by the first notch 301 to obtain the gate electrode 60 and the first capacitor plate, and/or the metal film 30 is divided by the first notch 301 to obtain the wire 70, which is not limited in this embodiment. The metal film 30 is the gate electrode layer, that is, the metal film 30 is a metal layer formed firstly on the array substrate, in this way, the quality of the subsequent film layer and then the performance of the array substrate may be improved.

In this embodiment, the array substrate has a display region and a non-display region surrounding the display region. There is a thin film transistor, a capacitor and other components in the display region; and the non-display region is arranged around the display region. The metal film 30 is provided with the first notch 301 and a second notch 304, the first notch 301 is provided in the non-display region, and the second notch 304 is disposed in the display region. In an implementation in which the metal film 30 is a gate electrode layer, the second notch 304 is configured to divide the metal film 30 to obtain the gate electrode 60 and the first notch 301 is configured to divide the metal film 30 to obtain the wire 70.

When fabricating, the second notch 304 may be formed by a second opening 104 which is provided in the mask, and the second opening 104 is a through hole, so that a sidewall slope of the second notch 304 is greater than that of the first notch 301. The slope refers to the acute angle formed between the sidewall of the gate electrode 60 or the wire 70 and the bottom surface of the notch after the metal film 30 forms the gate electrode 60 or the wire 70.

Exemplarily, the first opening 101 in the mask 10 may face a part of the metal film 30 in the non-display region; the mask 10 is also provided with the second opening 104 facing a part of the metal film 30 in the display region, the second through hole being the through hole.

Further, when the mask 10 is subjected to exposure, the first strong exposure area 201 and the weak exposure area 202 are formed in a part of the photoresist 20 corresponding to the non-display region, while a second strong exposure area 203 facing the second opening 104 is formed in a part of the photoresist 20 corresponding to the display region. After etching of the photoresist 20, the first notch 301 is formed in the part of the metal film 30 corresponding to the non-display region, while the second notch 304 is formed in the part of the metal film 30 corresponding to the display region.

Since the second opening 104 is the through hole, accordingly, the second notch 304 formed in the metal film 30 has a higher dimensional accuracy, and the metal film 30 is divided into the gate electrode 60 by the second notch 304, so that the gate electrode 60 has a higher dimensional accuracy, thereby increasing the performance of the thin film transistors in which the gate electrode 60 is located. The wire 70 is located in the non-display region, and the first notch 301 formed on the metal film 30 by the first opening 101 has a smaller sidewall slope, thereby avoiding the sliding of the subsequent film layers off the sidewall of the first notch 301 during the formation of subsequent film layer, and improving the quality of subsequent film layer.

In other implementations, the array substrate has a display region and a non-display region surrounding the display region, there is a plurality of first openings 101, and the display region and the non-display region are each provided with a plurality of the first openings 101. A plurality of the first notches 301 are provided in respective parts of the metal film 30 corresponding to the display region and the non-display region. The first notches 301 in the display region divide the metal film 30 to obtain gate electrodes 60 for driving thin film transistor, and the first notches 301 in the non-display region divide the metal film 30 into wires 70.

The thin film transistors provided on the array substrate include a driving thin film transistor and a switching thin film transistor. The first openings 101 are correspondingly provided in each of the display region and the non-display region. The first notches 301 formed by the first openings 101 in the display region divide the metal film 30 to obtain the gate electrodes 60 for driving thin film transistor, and the first notches 301 formed by the first openings 101 in the non-display region divide the metal film 30 into the wires 70. Since the driving transistor does not require high performance, such setting further avoids the sliding of the subsequent film layer off the sidewall of the first notches 301 during the formation of subsequent film layer, thereby improving the quality of subsequent film layer.

Further, the mask 10 is further provided with the second opening 104, and the second opening 104 is the through hole and is disposed to face a part of the metal film 30 in the display region. The second opening 104 is configured to form the second strong exposure area 203 in the photoresist 20, so as to form the second notch 304 in the part of the metal film 30 corresponding to the display region when etching. The second notch 304 is configured to divide the part of the metal film 30 corresponding to the display region to obtain a gate electrode for switching thin film transistor.

Referring to FIG. 1 to FIG. 6, there is further provided a fabrication method of an array substrate in the present embodiment. The method includes the following.

At S101, a substrate is provided.

The substrate may be made of silicon, germanium, etc., which may be formed through a deposition process exemplarily. After the substrate is formed, a buffer layer is further formed on the substrate, and the buffer layer may be made of silicon nitride or silicon oxide. After the buffer layer is formed, a channel structure 40 and a gate electrode insulating layer 50 covering the channel structure 40 are formed in the buffer layer.

After the gate electrode insulating layer 50 is formed, the method further includes the following.

At S102, the metal film 30 is formed on the substrate.

The array substrate includes the substrate, and the buffer layer, the channel structure 40, the gate electrode insulating layer 50, the gate electrode layer, a first insulating layer, a capacitor layer, a second insulating layer and a source electrode layer or a drain electrode layer stacked sequentially which are on the substrate. The gate electrode layer is a metal layer and includes a first capacitor plate, a gate electrode 60 and a wire 70. The capacitor layer is a metal layer and includes a second capacitor plate facing the first capacitor plate, so that the first capacitor plate and the second capacitor plate may form a capacitor. The source electrode layer and the drain electrode layer may also be a metal layer, and the source/drain electrode is configured to be connected with the channel structure 40.

It is worth noting that in the present embodiment, the metal film 30 may be the gate electrode layer, and the metal film 30 is configured to form the gate electrode 60, the first capacitor plate and the wire 70 facing the channel structure 40. Exemplarily, the wire 70 may be a scan wire or a data wire. Certainly, in the present embodiment, the metal film 30 may also be a capacitor layer or a source electrode layer, a drain electrode layer and the like, and the metal film 30 is not limited in the present embodiment.

After the metal film 30 is formed, the method further includes the following.

At S103, a photoresist is formed on the metal film, and the photoresist is covered by a mask. The mask has a first opening, which is provided with a semi-permeable membrane therein, and the semi-permeable membrane is provided with a light-transmitting hole.

Exemplarily, the mask 10 may be formed by a halftone process, so that the first opening 101 has a semi-permeable membrane 102 with a lower transmittance therein, and the semi-permeable membrane 102 is provided with a light-transmitting hole 103.

After the mask 10 is formed, the method further includes the following.

At S104, the photoresist is subjected to exposure so as to form a first strong exposure area facing the light-transmitting hole and a weak exposure area facing the semi-permeable membrane in the photoresist.

Since light has a lower light transmittance in the semi-permeable membrane 102, during exposure, there exists less light through the semi-permeable membrane 102, so that a part of the photoresist 20 facing the semi-permeable membrane 102 is exposed to a weaker extent, thereby forming the weak exposure area 202. The light entering the light-transmitting hole 103 may be uniformly irradiated on the photoresist 20, so that the part of the photoresist 20 facing the light-transmitting hole 103 is exposed to a higher degree, thereby forming the first strong exposure area 201.

After the mask 10 is subjected to exposure, the method further includes the following.

At S105, the metal film is etched to form the first notch in the metal film. The first notch includes a first groove facing the first strong exposure area and a second groove facing the weak exposure area, and the bottom surface of the first groove is closer to the substrate compared to that of the second groove. On the plane parallel to the substrate, the projection of the first groove is located within that of the second groove.

Specifically, the first strong exposure area 201 is subjected to exposure at a higher degree, such that the photoresist 20 in the first strong exposure area 201 is etched faster; the weak exposure area 202 is subjected to exposure at a weaker degree, so that the weak exposure area 202 is etched at a slower rate. Therefore, within the same etching time, the part of the metal film 30 corresponding to the first strong exposure area 201 is etched to a larger depth, and the part of the metal film 30 corresponding to the weak exposure area 202 is etched to a smaller depth, such that the bottom surface of the first groove 302 is closer to the substrate compared to that of the second groove 303.

In an implementation in which the metal film 30 is a gate electrode layer, the first notch 301 is formed after etching of the photoresist 20. The first notch 301 may be enclosed to form the gate electrode 60 and the first capacitor plate, and/or the first notch 301 may be enclosed to form the wire 70, which is not limited in the present embodiment. The metal film 30 is the gate electrode layer, that is, the metal film 30 is a metal layer formed firstly on the array substrate, in this way, the quality of the subsequent film layer and then the performance of the array substrate may be improved.

Further, after etching of the photoresist 20, the method further includes forming an insulating film on the metal film 30, and forming other metal film on the insulating film. Exemplarily, the other metal film may be the capacitor layer, and the corresponding insulating film is the first insulating layer. Certainly, the other metal film may be the source electrode layer or drain electrode layer, and the corresponding insulating film is the second insulating layer.

After the other metal film is formed, the second capacitor plate or the source electrode, the drain electrode, and other shapes may be formed in the same manner as the metal film 30 in order to form the notch sidewall with a smaller slope by the other metal film after etching. During the formation of subsequent film layer, the subsequent film layer may completely cover the other metal film, improving the performance of the array substrate. It is worth noting that since a shape of other metal film may vary from that of the metal film 30, accordingly, the shape and position of the first notch 301 of the mask 10 corresponding to the other metal film are different from those of the mask 10 corresponding to the metal film 30.

In the present embodiment, there is provided a fabrication method of an array substrate. The photoresist 20 is formed on the first metal layer and is covered by the mask 10, where the mask 10 has the first opening 101, the first opening 101 is provided with the semi-permeable membrane 102, and the semi-permeable membrane 102 is provided with the light-transmitting hole 103. After the photoresist 20 is subjected to exposure, the first strong exposure area 201 facing the light-transmitting hole 103 and the weak exposure area 202 facing the semi-permeable membrane 102 are formed in the photoresist 20. The metal film 30 is etched to form the first notch 301 in the metal film 30, and the first notch 301 includes the first groove 302 facing the first strong exposure area 201 and the second groove 303 facing the weak exposure area 202. The bottom surface of the first groove 302 is closer to the substrate compared to that of the second groove 303. The projection of the first groove 302 on the plane parallel to the substrate is located within that of the second groove 303 on the plane parallel to the substrate. In this way, the first groove 302 and the second groove 303 form the first notch 301, which divides the metal film 30 to obtain corresponding shapes, and the second groove 303 has a smaller depth, thereby reducing the sidewall slope of the first notch 301. As a result, the sliding of subsequent film layers off the first notch 301 sidewall during the formation of the subsequent film layers may be avoided. The metal film 30 may be covered by the subsequent film layers, thereby improving the performance of the array substrate.

In addition, since the sidewall slope of the first notch 301 is reduced, the photoresist located at the first notch 301 is not too thick, thereby avoiding residue of the photoresist during etching process.

In this embodiment, the substrate has the display region and the non-display region surrounding the display region, and there are thin film transistors, capacitors and other components in the display region; and the non-display region is arranged around the display region. Accordingly, the first opening 101 in the mask 10 may be faced to a part of the metal film 30 in the non-display region; and the mask 10 is also provided with the second opening 104 facing a part of the metal film 30 in the display region, and the second opening 104 is a through role.

Further, when the mask 10 is subjected to exposure, the first strong exposure area 201 and the weak exposure area 202 are formed in a part of the photoresist 20 corresponding to the non-display region, while a second strong exposure area 203 facing the second opening 104 is formed in a part of the photoresist 20 corresponding to the display region. After etching of the photoresist 20, the first notch 301 is formed in the part of the metal film 30 corresponding to the non-display region, while the second notch 304 is formed in the part of the metal film 30 corresponding to the display region. The second opening 104 is the through hole, so that the sidewall slope of the second notch 304 is greater than the sidewall slope of the first notch 301.

In an implementation in which the metal film 30 is a gate electrode layer, the second notch 304 is configured to divide the metal film 30 to obtain the gate electrode 60 and the first notch 301 is configured to divide the metal film 30 to obtain the wire 70.

Since the second opening 104 is the through hole, accordingly, the second notch 304 formed in the metal film 30 has a higher dimensional accuracy, and the metal film 30 is divided by the second notch 304 to obtain the gate electrode 60, so that the gate electrode 60 has a higher dimensional accuracy, thereby increasing the performance of the thin film transistor in which the gate electrode 60 is located. The wire 70 is located in the non-display region, and the first notch 301 formed in the metal film 30 by the first opening 101 has a smaller sidewall slope, thereby avoiding the sliding of the subsequent film layers off the sidewall of the first notch 301 during the formation of subsequent film layers, and improving the quality of subsequent film layers.

In other implementations, the array substrate has a display region and a non-display region surrounding the display region, there is a plurality of first openings 101, and the display region and the non-display region are all provided with a plurality of the first openings 101. After etching of the photoresist 20, the first notches 301 are formed in respective parts of the metal film 30 corresponding to the display region and the non-display region. The first notches 301 in the display region divide the metal film 30 to obtain gate electrodes 60 for driving thin film transistor, and the first notches 301 in the non-display region divide the metal film 30 to obtain wires 70.

The thin film transistors provided on the array substrate include a driving thin film transistor and a switching thin film transistor. The first openings 101 are correspondingly provided in each of the display region and the non-display region. The first notches 301 formed by the first openings 101 in the display region are configured to divide the metal film 30 to obtain the gate electrodes 60 for driving thin film transistor, and the first notches 301 formed by the first openings 101 in the non-display region are configured to divide the metal film 30 to obtain the wires 70. Since the driving transistor does not require high performance, this setting further avoids the sliding of the subsequent film layers off the sidewall of the first notches 301 during the formation of subsequent film layers, thereby improving the quality of the subsequent film layers.

Further, the mask 10 is further provided with the second opening 104, and the second opening 104 is a through hole, and is disposed to face a part of the metal film 30 in the display region. The second opening 104 is configured to form the second strong exposure area 203 in the photoresist 20, so as to form the second notch 304 in the part of the metal film 30 corresponding to the display region when etching. The second notch 304 is configured to divide the part of the metal film 30 corresponding to the display region into the gate electrode 60 for switching thin film transistor.

Referring to FIG. 2-FIG. 6, in the embodiment of the present application, there is further provided a mask 10, including a plate body, where the plate body is provided with a first opening 101, the first opening 101 is provided with a semi-permeable membrane 102, and the semi-permeable membrane 102 is provided with a light-transmitting hole 103. The mask 10 is configured to etch a metal film 30 on an array substrate, so as to form a first groove 302 facing the light-transmitting hole 103 and a second groove 303 facing the semi-permeable membrane 102 in the metal film 30. Exemplarily, the mask 10 may be formed by a halftone process, so that the first opening 101 has the semi-permeable membrane 102 with a lower transmittance, and the semi-permeable membrane 102 is provided with the light-transmitting hole 103.

The mask 10 provided by the present embodiment is configured to fabricate the metal film 30 on the array substrate. The array substrate includes a substrate, and a buffer layer, a channel structure 40, a gate electrode insulating layer 50, a gate electrode layer, a first insulating layer, a capacitor layer, a second insulating layer and a source electrode layer or a drain electrode layer stacked sequentially on the substrate; among them, the gate electrode layer is a metal layer and includes a first capacitor plate, a gate electrode 60 and a wire 70; the capacitor layer is a metal layer and includes a second capacitor plate facing the first capacitor plate, so that the first capacitor plate and the second capacitor plate may form a capacitor; the source electrode layer and the drain electrode layer may also be a metal layer, and the source/drain electrode is configured to be connected with the channel structure 40.

It is worth noting that in the present embodiment, the metal film 30 may be the gate electrode layer, and the metal film 30 is configured to form the gate electrode 60, the first capacitor plate and the wire 70 facing the channel structure 40. Exemplarily, the wire 70 may be a scan wire or a data wire. Certainly, in this embodiment, the metal film 30 may also be a capacitor layer or a source electrode layer, a drain electrode layer and the like, and the metal film 30 is not limited in the present embodiment.

During use, the metal film 30 is firstly formed, followed by forming the photoresist 20 on the metal film 30, and the photoresist 20 is covered by the mask 10; then the photoresist 20 is subjected to exposure to form a first strong exposure area 201 facing the light-transmitting hole 103 and a weak exposure area 202 facing the semi-permeable membrane 102 in the photoresist 20; and the metal film 30 is etched to form the first notch 301 in the metal film 30. The first notch 301 includes the first groove 302 facing the first strong exposure area 201 and the second groove 303 facing the weak exposure area 202, and the bottom of the first groove 302 is closer to the substrate compared to that of the second groove 303. In a plane parallel to the substrate, the projection of the first groove 302 is located within that of the second groove 303.

The first strong exposure area 201 has a higher degree of exposure, such that the photoresist 20 of the first strong exposure area 201 is etched at a faster rate; and the weak exposure area 202 has a weaker degree of exposure, such that the weak exposure area 202 is etched at a slower rate. Therefore, within the same etching time, a part of the metal film 30 corresponding to the first strong exposure area 201 is etched to a larger depth, and a part of the metal film 30 corresponding to the weak exposure area 202 is etched to a smaller depth, such that the depth of the first groove 302 is greater than the depth of the second groove 303.

Through above arrangement, the mask 10 has the first opening 101, the first opening 101 is provided with the semi-permeable membrane 102, and the semi-permeable membrane 102 is provided with the light-transmitting hole 103. After the photoresist 20 is subjected to exposure, the first strong exposure area 201 facing the light-transmitting hole 103 and the weak exposure area 202 facing the semi-permeable membrane 102 are formed in the photoresist 20. The metal film 30 is etched, so as to form the first notch 301 in the metal film 30. The first notch 301 includes the first groove 302 facing the first strong exposure area 201 and the second groove 303 facing the weak exposure area 202. The bottom surface of the first groove 302 is closer to the substrate compared to that of the second groove 303, and the projection of the first groove 302 in the plane parallel to the substrate is located within that of the second groove 303 in the plane parallel to the substrate. By such arrangement, the first groove 302 and the second groove 303 form the first notch 301, the first notch 301 divides the metal film 30 to obtain corresponding shapes, and the second groove 303 has a smaller depth, thereby reducing the slope of the sidewall of the first notch 301, and avoiding the sliding of a subsequent film layer off the first notch 301 sidewall when the subsequent film layer is formed. The subsequent film layer is able to cover the metal film 30, improving the performance of the array substrate.

In addition, since the slope of the first notch 301 is reduced, the photoresist formed at the first notch 301 is not too thick during the fabrication of the subsequence film layer, thereby avoiding residue of the photoresist during etching process.

The mask 10 in this embodiment may be configured to fabricate one or more of the gate electrode layer, the capacitor layer, and the source/drain electrode layer, and certainly, the mask 10 may also be configured to fabricate other metal films in the array substrate. It is worth noting that since there is difference in shapes of different metal films 30, accordingly, the first notches 301 in the mask 10 corresponding to different metal films 30 have different shapes and positions.

In an implementation in which the metal film 30 is a gate electrode layer, the first notch 301 is formed after etching of the photoresist 20. The first notch 301 may divide the metal film 30 into the gate electrode 60 and the first capacitor plate, and/or the first notch 301 may divide the metal film 30 into the wire 70, which is not limited in the present embodiment. The metal film 30 is the gate electrode layer, that is, the metal film 30 is a metal layer formed firstly on the array substrate, in this way, the quality of the subsequent film layer and the performance of the array substrate may be improved.

In this embodiment, the array substrate has the display region and the non-display region surrounding the display region, and there are thin film transistors, capacitors and other components in the display region; and the non-display region is arranged around the display region. Accordingly, the first opening 101 in the mask 10 may be faced to a part of the metal film 30 in the non-display region; and the mask 10 is also provided with the second opening 104 facing a part of the metal film 30 in the display region, and the second opening 104 is a through role.

Further, when the photoresist 20 is subjected to exposure, the first strong exposure area 201 and the weak exposure area 202 are formed on a part of the photoresist 20 corresponding to the non-display region, while a second strong exposure area 203 facing the second opening 104 is formed in a part of the photoresist 20 corresponding to the display region. After etching of the metal film 30, the first notch 301 is formed in the part of the metal film 30 corresponding to the non-display region, while the second notch 304 is formed in the part of the metal film 30 corresponding to the display region. The second opening 104 is the through hole, so that the sidewall slope of the second notch 304 is greater than the sidewall slope of the first notch 301.

In an implementation in which the metal film 30 is a gate electrode layer, the second notch 304 is configured to divide the metal film 30 to obtain the gate electrode 60 and the first notch 301 is configured to divide the metal film 30 to obtain the wire 70.

Since the second opening 104 is the through hole, accordingly, the second notch 304 formed in the metal film 30 has a higher dimensional accuracy, and the metal film 30 is divided into the gate electrode 60 by the second notch 304, so that the gate electrode 60 has a higher dimensional accuracy, thereby increasing the performance of the thin film transistor in which the gate electrode 60 is located. The wire 70 is located in the non-display region, and the first notch 301 formed in the metal film 30 by the first opening 101 has a smaller sidewall slope, thereby avoiding the sliding of the subsequent film layers off the sidewall of the first notch 301 during the formation of the subsequent film layers, and improving the quality of the subsequent film layers.

In other implementations, the array substrate has a display region and a non-display region surrounding the display region, there is a plurality of first openings 101, and the display region and the non-display region are all provided with a plurality of the first openings 101. After etching of the photoresist 20, the first notches 301 are formed in the metal film 30 in each of the display region and the non-display region. The first notches 301 in the display region divide the metal film 30 to obtain the gate electrodes 60 for driving thin film transistors, and the first notches 301 in the non-display region divide the metal film 30 to obtain the wires 70.

The thin film transistors provided on the array substrate include a driving thin film transistor and a switching thin film transistor. The first openings 101 are correspondingly provided in each of the display region and the non-display region. The first notches 301 formed by the first openings 101 in the display region are configured to divide the metal film 30 to obtain the gate electrodes 60 for driving thin film transistor, and the first notches 301 formed by the first openings 101 in the non-display region are configured to divide the metal film 30 to obtain the wires 70. Since the driving transistor does not require high performance, this setting further avoids the sliding of the subsequent film layers off the sidewall of the first notches 301 during the formation of the subsequent film layers, thereby improving the quality of the subsequent film layers.

Further, the mask 10 is further provided with the second opening 104, and the second opening 104 is the through hole, and is disposed facing a part of the metal film 30 in the display region. The second opening 104 is configured to form the second strong exposure area 203 in the photoresist 20, so as to form the second notch 304 in the part of the metal film 30 corresponding to the display region when etching. The second notch 304 is configured to divide the part of the metal film 30 corresponding to the display region to obtain the gate electrode 60 for switching thin film transistor.

Finally, it should be noted that the foregoing embodiments are only intended for illustrating the technical solutions of the present application rather than limiting them. Although the present application has been described in detail with reference to the foregoing embodiments, those skilled in the art should understand that they may still make modifications to the technical solutions described in the foregoing embodiments or make equivalent substitutions to some or all of technical features thereof, and these modifications or substitutions do not depart the essence of the corresponding technical solutions from the scope of the technical solutions of the embodiments of the present application.

Which is claimed is:

1. An array substrate, comprising:

a substrate; and a metal film disposed on the substrate;

wherein the metal film is provided with a first notch, the first notch comprises a first groove located in a middle of the first notch and a second groove located at an edge of the first groove and communicated with the first groove, a bottom surface of the first groove is closer to the substrate compared to a bottom surface of the second groove, a projection of the first groove on a plane parallel to the substrate is located within that of the second groove on the plane parallel to the substrate, a depth of the first groove is greater than that of the second groove, and a sidewall slope of the first groove is less than that of the second groove;

wherein the array substrate has a display region and a non-display region surrounding the display region, the metal film is also provided with a second notch, the second notch is disposed in the display region, the metal film is divided by the second notch to obtain a gate electrode, the first notch is disposed in the non-display region, the metal film is divided by the first notch to obtain a wire, and a sidewall slope of the second notch is greater than that of the second groove; and wherein a sidewall slope of the second notch is greater than that of the first notch.

2. The array substrate according to claim 1, wherein sidewalls of the first notch corresponding to the second groove and the first groove are a stepped form.

3. The array substrate according to claim 1, wherein the wire is a scan wire or a data wire.

4. The array substrate according to claim 1, wherein the metal film is in a form of a capacitor layer, a source electrode layer, or a drain layer.

5. The array substrate according to claim 1, wherein the metal film is a gate electrode layer.

* * * * *